(12) United States Patent
Ikemoto et al.

(10) Patent No.: US 9,105,540 B2
(45) Date of Patent: Aug. 11, 2015

(54) SOLID-STATE IMAGING DEVICE HAVING MAIN WAVEGUIDE WITH FIRST AND SECOND SUB WAVEGUIDES

(75) Inventors: Kiyokatsu Ikemoto, Yokohama (JP); Akinari Takagi, Yokosuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 92 days.

(21) Appl. No.: 13/979,281

(22) PCT Filed: Jan. 16, 2012

(86) PCT No.: PCT/JP2012/051282
§ 371 (c)(1),
(2), (4) Date: Jul. 11, 2013

(87) PCT Pub. No.: WO2012/099262
PCT Pub. Date: Jul. 26, 2012

(65) Prior Publication Data
US 2013/0277541 A1     Oct. 24, 2013

(30) Foreign Application Priority Data
Jan. 18, 2011   (JP) .................................. 2011-007708

(51) Int. Cl.
*H01L 27/00* (2006.01)
*H01J 3/14* (2006.01)
*H01L 27/146* (2006.01)
*G02B 7/34* (2006.01)
(Continued)

(52) U.S. Cl.
CPC ............ *H01L 27/14625* (2013.01); *G02B 7/34* (2013.01); *H01L 27/14629* (2013.01); *G02B 6/2813* (2013.01); *G02B 6/42* (2013.01)

(58) Field of Classification Search
CPC .................................................. H01L 27/14629
USPC ............................................... 250/216, 208.1
See application file for complete search history.

(56) References Cited

U.S. PATENT DOCUMENTS 5,396,570 A    3/1995   Jenkins et al. .................. 385/28
6,312,969 B1   11/2001  Abe
(Continued)

FOREIGN PATENT DOCUMENTS

CN    101425524    5/2009
CN    101900867    12/2010
(Continued)

*Primary Examiner* — Thanh Luu
(74) *Attorney, Agent, or Firm* — Fitzpatrick, Cella, Harper & Scinto

(57) ABSTRACT

Provided is a solid-state imaging device capable of ranging with high precision even when the pixel size is small. The solid-state imaging device includes: an optical waveguide having multiple regions with different refractive indices; and a photoelectric conversion unit for converting light guided through the optical waveguide into an electrical signal. The optical waveguide includes a main waveguide located on a light incident side, and a first sub waveguide and a second sub waveguide connected to the main waveguide and located on the photoelectric conversion unit side. The main waveguide guides light which enters from a first direction and light which enters from a second direction. The first sub waveguide and the second sub waveguide guide light which has entered from the first direction and has passed through the main waveguide and light which has entered from the second direction and has passed through the main waveguide, respectively.

13 Claims, 10 Drawing Sheets

(51) Int. Cl.
   *G02B 6/28* (2006.01)
   *G02B 6/42* (2006.01)

(56) References Cited

U.S. PATENT DOCUMENTS

| | | |
|---|---|---|
| 7,812,299 B2 | 10/2010 | Kusaka |
| 8,514,309 B2 | 8/2013 | Kato et al. ............ 348/294 |
| 8,525,282 B2 | 9/2013 | Numata et al. ............ 257/432 |
| 8,634,017 B2 | 1/2014 | Komuro |
| 2004/0004668 A1* | 1/2004 | Namazue et al. ............ 348/340 |
| 2006/0192883 A1 | 8/2006 | Katsuno et al. |
| 2009/0090841 A1 | 4/2009 | Kusaka ............ 250/201.2 |
| 2010/0302432 A1 | 12/2010 | Komuro ............ 348/340 |
| 2010/0314704 A1 | 12/2010 | Matsugai |
| 2011/0063484 A1 | 3/2011 | Fujii et al. ............ 348/294 |
| 2011/0199521 A1 | 8/2011 | Kato et al. ............ 348/294 |
| 2011/0249161 A1 | 10/2011 | Takagi ............ 348/294 |

FOREIGN PATENT DOCUMENTS

| | | |
|---|---|---|
| CN | 101924114 | 12/2010 |
| EP | 2 249 192 | 11/2010 |
| EP | 2 249 192 A1 | 11/2010 |
| JP | 2002-314062 A | 10/2002 |
| JP | 2008071972 | 3/2008 |
| JP | 2010276712 A | 12/2010 |
| WO | 2007011026 A | 1/2007 |
| WO | 2010/134626 | 11/2010 |
| WO | 2010-134626 A1 | 11/2010 |
| WO | 2010134626 A | 11/2010 |

\* cited by examiner

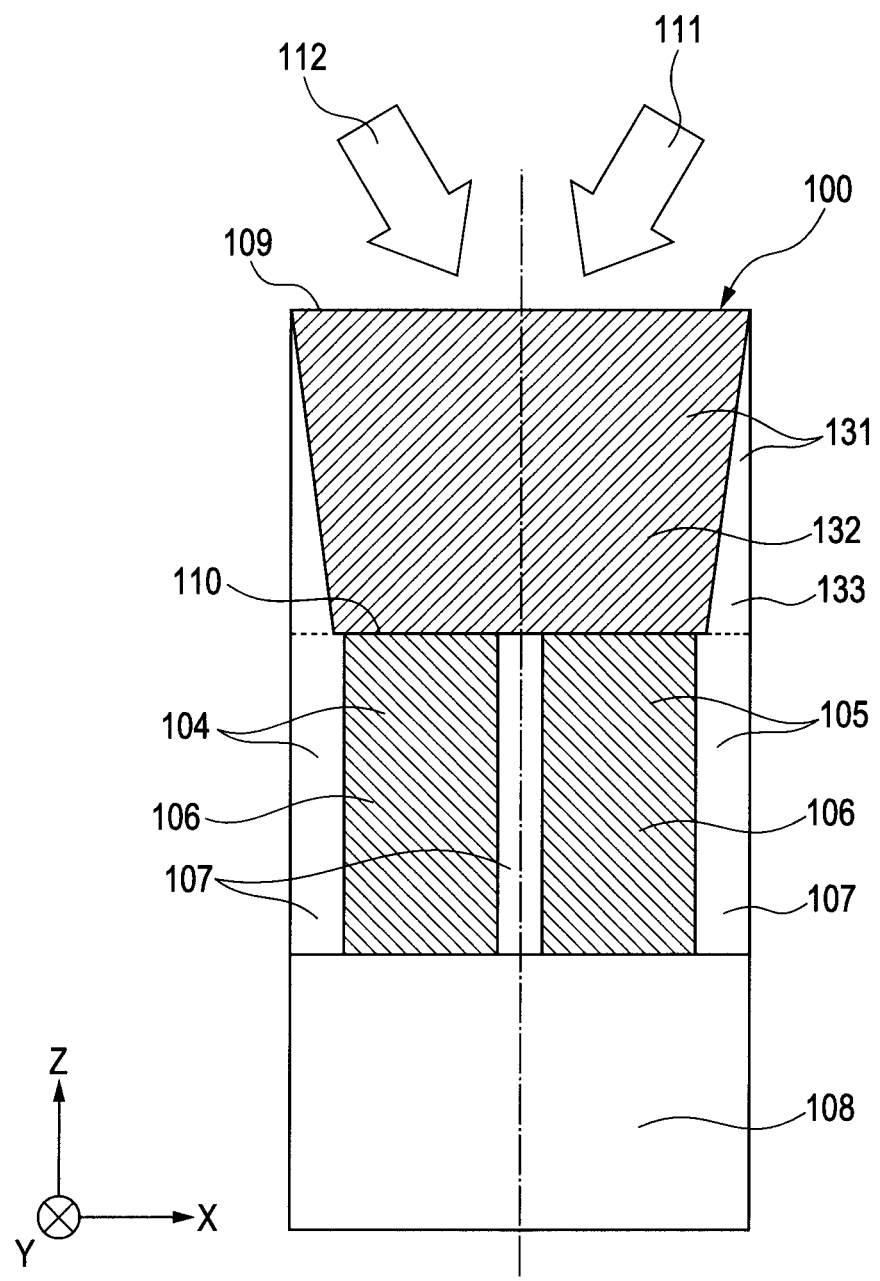

SOLID-STATE IMAGING DEVICE HAVING MAIN WAVEGUIDE WITH FIRST AND SECOND SUB WAVEGUIDES

TECHNICAL FIELD

The present invention relates to a solid-state imaging device and an imaging system including a solid-state imaging device, and more particularly, to a solid-state imaging device for use in a digital still camera, a digital video camera, and the like.

BACKGROUND ART

In a digital still camera or a video camera, technologies for detecting distances for auto focusing (AF) are known. With regard to such technologies for detecting distances for AF, Japanese Patent Application Laid-Open No. 2002-314062 (hereinafter, referred to as Patent Literature 1) proposes a solid-state imaging device in which a part of pixels of an imaging device have a ranging function and the detection is made by a phase difference system.

The phase difference system is a method in which optical images which pass through different regions on a pupil of a camera lens are compared and triangulation using a stereo image is used to detect the distance.

In such a method, differently from the case of a conventional contrast system, it is not necessary to move the lens in order to carry out ranging, and thus, AF at high speed with high precision is possible. Further, real-time AF when moving images are taken is possible.

In Patent Literature 1 mentioned above, as a structure of a ranging pixel, a structure in which a microlens and multiple photoelectric conversion units thereunder are provided is disclosed.

This enables selective introduction of light which passes through a predetermined region on the pupil of the camera lens to the photoelectric conversion unit to carry out ranging.

SUMMARY OF INVENTION

Technical Problem

However, in the structure disclosed in Patent Literature 1 mentioned above, light which passes through the microlens is affected by scattering at a wiring member or the like and light flux cannot be separated enough, and thus, there is a problem that the ranging precision is lowered.

Further, in the structure disclosed in Patent Literature 1, light having a small incident angle reaches a region between two photoelectric conversion units, is not detected by the photoelectric conversion units, and becomes a loss. Therefore, light intensity detected by the ranging pixel is low and is more liable to be affected by noise, and the ranging precision is lowered.

Further, when the structure described in Patent Literature 1 is applied to a solid-state imaging device with a small pixel size, the following problem arises.

As the pixel size becomes smaller, the F value of the microlens for introducing light to the photoelectric conversion unit becomes larger, and the pixel size and the size of a diffraction image become almost the same.

Therefore, light extends in the pixel, and thus, light flux cannot be separated enough and the ranging precision is further lowered.

Solution to Problem

The present invention has been made in view of the above-mentioned problem, and an object of the present invention is to provide a solid-state imaging device and an imaging system having a solid-state imaging device which can carry out ranging with high precision, and in particular, which can carry out ranging with high precision even when the pixel size is small.

A solid-state imaging device according to the present invention includes: an optical waveguide having multiple regions with different refractive indices; and a photoelectric conversion unit for converting light guided through the optical waveguide into an electrical signal, in which: the optical waveguide includes a main waveguide located on a light incident side, and a first sub waveguide and a second sub waveguide connected to the main waveguide and located on the photoelectric conversion unit side; the main waveguide guides light which enters from a first direction and light which enters from a second direction; and the first sub waveguide and the second sub waveguide guide light which has entered from the first direction and has passed through the main waveguide and light which has entered from the second direction and has passed through the main waveguide, respectively.

Advantageous Effects of Invention

According to the present invention, there can be realized a solid-state imaging device which can carry out ranging with high precision, and in particular, which can carry out ranging with high precision even when the pixel size is small, and an imaging system including the solid-state imaging device.

BRIEF DESCRIPTION OF DRAWINGS

FIG. 5 is a schematic sectional view of a ranging pixel disposed in a solid-state imaging device according to the first embodiment.

DESCRIPTION OF EMBODIMENTS

Figure 1:
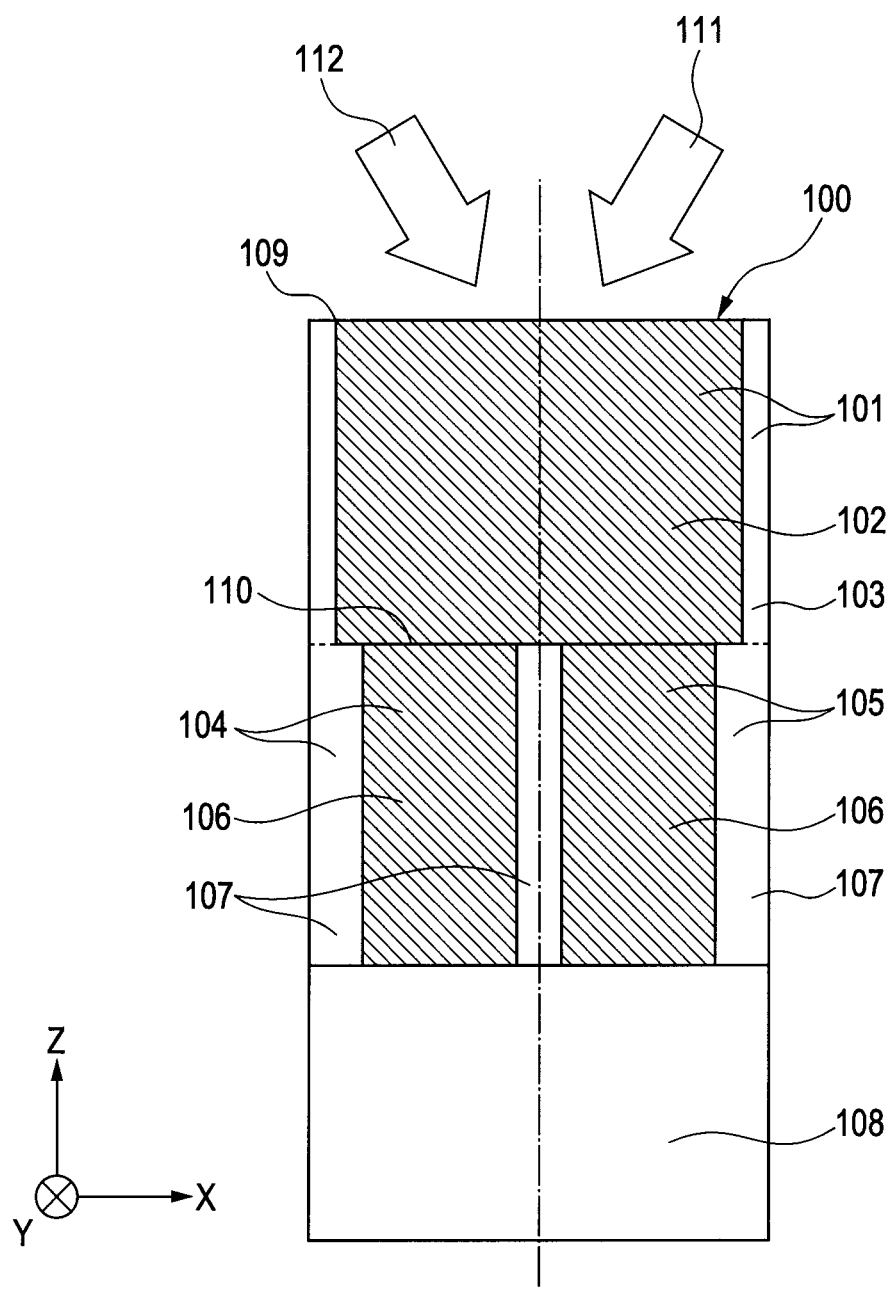
FIG. 1 is a schematic sectional view of a ranging pixel disposed in a solid-state imaging device according to a first embodiment.

The present invention uses the property that a light propagation state (waveguide mode) in a waveguide varies depending on an incident angle of light flux which enters the waveguide.

More specifically, multiple photoelectric conversion units are disposed in a pixel and a waveguide structure is appropriately formed. This enables introduction of light which has entered at a predetermined angle among the incident light to a predetermined photoelectric conversion unit and detection thereof to materialize a solid-state imaging device capable of ranging with high precision.

The solid-state imaging device according to the present invention is a solid-state imaging device which includes an optical waveguide having multiple regions with different refractive indices and a photoelectric conversion unit for converting light that is guided through the optical waveguide into an electrical signal.

According to the present invention, the optical waveguide includes a main waveguide located on a light incident side, and first and second sub waveguides connected to the main waveguide and located on the photoelectric conversion unit side.

The main waveguide guides light which enters from a first direction and light which enters from a second direction. The first and second sub waveguides guide light which has entered from the first direction and has passed through the main waveguide and light which has entered from the second direction and has passed through the main waveguide, respectively.

In the solid-state imaging device according to the present invention, each of the multiple regions with different refractive indices includes a core member and a clad member.

Further, in the solid-state imaging device according to the present invention, in one of the first and second sub waveguides, the intensity of light which enters from the first direction, introduced by the one of the first sub waveguide and the second sub waveguide, and exits is higher than the intensity of light which enters from the second direction, introduced by the one of the first sub waveguide and the second sub waveguide, and exits, while, in another one of the first sub waveguide and the second sub waveguide, the intensity of light which enters from the second direction, introduced by the another one of the first sub waveguide and the second sub waveguide, and exits is higher than the intensity of light which enters from the first direction, introduced by the another one of the first sub waveguide and the second sub waveguide, and exits.

A solid-state imaging device according to embodiments of the present invention is described in the following with reference to the attached drawings.

Note that, the same reference numerals are used to designate members having the same functions throughout the figures in principle, and repeated description thereof is omitted as much as possible.

First Embodiment

As a first embodiment, an exemplary structure of the solid-state imaging device according to the present invention is described with reference to FIG. 1.

In FIG. 1, a ranging pixel 100 is disposed in a part of the solid-state imaging device of this embodiment.

The pixel 100 includes from a light incident side (+z side) a main waveguide 101 (a core member 102 and a clad member 103), a sub waveguide (first sub waveguide) 104 and a sub waveguide (second sub waveguide) 105, and a substrate 108. Here, the core member 102 and the clad member 103 form multiple regions with different refractive indices of the optical waveguide.

An end surface on the incident side (+z side) of the main waveguide 101 is referred to as an incident end surface 109 while an end surface on an exit side (−z side) is referred to as an exit end surface 110.

The sub waveguides 104 and 105 are disposed between the exit end surface 110 of the main waveguide 101 and the substrate 108, and each has a core member 106 and a clad member 107.

The core members 102 and 106, and the clad members 103 and 107 are formed of a transparent material in a wavelength band in the imaging, such as $SiO_2$, SiN, or an organic material.

Note that, the core member 102 is formed of a material having a refractive index which is higher than that of the clad member 103, and the core member 106 is formed of a material having a refractive index which is higher than that of the clad member 107.

This enables confinement of light in the core members 102 and 106 to be propagated.

The substrate 108 is formed of a material which absorbs light in the wavelength band in the imaging, for example, Si, and includes a photoelectric conversion unit formed in at least a partial region inside thereof by ion implantation or the like.

A light flux which has entered the pixel 100 from the outside is adapted to be able to propagate through the main waveguide 101 and the sub waveguides 104 and 105 to exit into the substrate 108.

If the photoelectric conversion unit is provided below the sub waveguide 104 or 105, exit light reaches the photoelectric conversion unit, is converted into electrons, and the electrons are output to a signal processing circuit (not shown).

A light flux 111 which has entered the pixel 100 from the first direction is converted into a waveguide mode 113 (FIG. 2A) of the main waveguide 101, propagates through the main waveguide, and is further converted into a waveguide mode 115 (FIG. 2A) of the sub waveguide 104 and propagates through the sub waveguide 104. On the other hand, a light flux 112 which has entered the pixel 100 from the second direction is converted into a waveguide mode 114 (FIG. 2B) of the main waveguide 101, propagates through the main waveguide, and is further converted into a waveguide mode 116 (FIG. 2B) of the sub waveguide 105 and propagates through the sub waveguide 105. The waveguide mode is expressed by the sum of multiple eigenmodes of the optical waveguide and indicates a state of propagation through the optical waveguide.

The eigenmode is uniquely determined by the shapes and the refractive indices of the core member and the clad member of the optical waveguide. When the light fluxes 111 and 112 enter the main waveguide 101, the light fluxes 111 and 112 are coupled to multiple eigenmodes and propagate in intrinsic waveguide modes.

The ratio of an eigenmode which forms the waveguide mode varies depending on the incident angle, which results in different electric field distributions in the waveguide mode.

By appropriately setting the shape and the medium of the main waveguide 101, propagation in a waveguide mode having different electric field distributions depending on the incident angle may be carried out.

Further, by coupling the respective waveguide modes of light which propagates through the main waveguide 101 to the waveguide modes of the respective sub waveguides, the respective incident light fluxes having different incident angles are caused to propagate through the different sub waveguides 104 and 105.

As the electric field distributions of two waveguide modes at a connecting portion of the waveguides are closer to each other, the coupling efficiency between the waveguide modes becomes higher.

The main waveguide 101 and the sub waveguides 104 and 105 are provided so that the electric field distributions of the waveguide mode 113 in the main waveguide 101 and of the waveguide mode 115 in the sub waveguide 104 are close to each other.

Further, the main waveguide 101 and the sub waveguides 104 and 105 are provided so that the electric field distributions of the waveguide mode 114 in the main waveguide 101 and of the waveguide mode 116 in the sub waveguide 105 are close to each other. With this, the light flux 111 which enters from the first direction propagates to the sub waveguide 104 because the waveguide mode 113 is coupled to the waveguide mode 115 with high efficiency.

On the other hand, the coupling efficiency between the waveguide mode 113 and the waveguide mode 116 is lowered to reduce light which propagates to the sub waveguide 105.

Further, if the incident direction deflects from the first direction, the incident light propagates in a waveguide mode having an electric field distribution different from that of the waveguide mode 113, and thus, light which propagates to the sub waveguide 104 is reduced.

Similarly, the incident light flux 112 from the second direction propagates to the sub waveguide 105 and light which propagates to the sub waveguide 105 is reduced.

Thus, to the sub waveguide 104, the light flux 111 from the first direction is introduced and light from directions other than that direction is reduced.

Further, to the sub waveguide 105, the light flux 112 from the second direction is introduced and light from directions other than that direction may be reduced.

Further, light which propagates in the waveguide modes 115 and 116 in the sub waveguides 104 and 105, respectively, are confined in the respective sub waveguides, and exits into the substrate with its spatial extent being suppressed.

This limits the exit light distribution in the substrate. If the photoelectric conversion unit is appropriately disposed under each of the sub waveguides 104 and 105, the light in each of the sub waveguides exits to a region in which the photoelectric conversion unit exists, and thus, light may be detected with efficiency.

Even if wiring and the like are provided in a region other than the waveguide, the incident light propagates concentratedly through the core member of the waveguide, and thus, effects of scattering by a wiring member or the like are alleviated. Even if the pixel size becomes smaller, light is confined in the core member of the waveguide, and thus, the light may propagate without extending in the pixel. By those effects, light in accordance with the incident angle may be introduced to the photoelectric conversion unit with efficiency.

The main waveguide may cause even light having a small incident angle to propagate in different waveguide modes depending on the incident directions.

By coupling the waveguide mode in the main waveguide and the waveguide mode in the sub waveguide and propagating through the sub waveguide, even light having a small incident angle may be separated.

If a photoelectric conversion unit is provided on the exit side of each of the sub waveguides, each light which is separated may be detected, and loss light which reaches a region without the photoelectric conversion unit may be reduced.

The waveguide modes in the main waveguide 101 and the sub waveguides 104 and 105 depend on the shapes, the media, or the locations of the respective waveguides.

In the structure described in this embodiment, by appropriately setting the shapes, the media, and the locations of the respective waveguides, the effects described above may be obtained, and light in accordance with the incident angle may be detected with higher precision and higher efficiency.

Figure 2A:
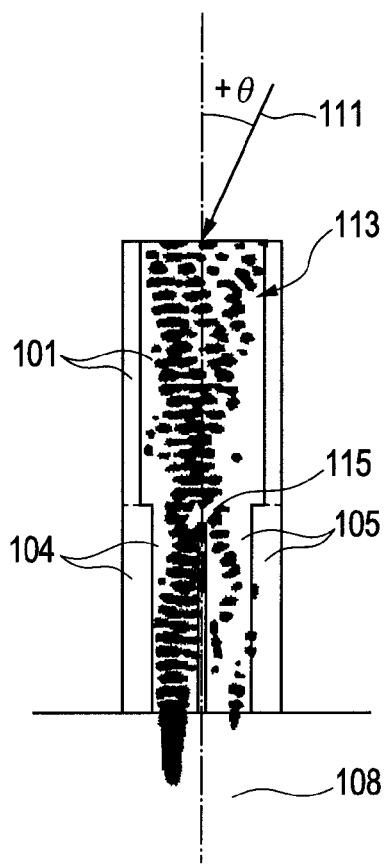
FIG. 2A is a view illustrating a waveguide mode in an optical waveguide according to the first embodiment.
Figure 2B:
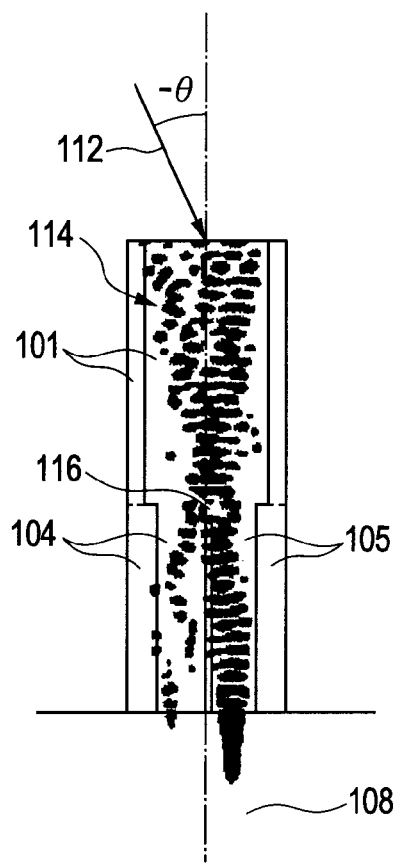
FIG. 2B is a view illustrating a waveguide mode in the optical waveguide according to the first embodiment.

FIGS. 2A and 2B illustrate the waveguide modes in the waveguides.

FIG. 2A illustrates electric field intensity distributions in the first waveguide mode 113 in the main waveguide 101 and in the waveguide mode 115 in the sub waveguide 104 of the light flux 111 which enters at an angle +θ (first direction).

FIG. 2B illustrates electric field intensity distributions in the second waveguide mode 114 in the main waveguide 101 and in the waveguide mode 116 in the sub waveguide 105 of the light flux 112 which enters at an angle −θ (second direction). In this way, the waveguide modes in the respective waveguides differ depending on the incident angles.

As illustrated in FIG. 2A, the light flux 111 which enters from the first direction is converted into the first waveguide mode 113, is guided through the waveguide 101, and, by being coupled to the waveguide mode 115, is guided through the sub waveguide 104.

On the other hand, as illustrated in FIG. 2B, the light flux 112 which enters from the second direction is converted into the second waveguide mode 114, is guided through the waveguide 101, and, by being coupled to the waveguide mode 116, is guided through the sub waveguide 105.

Figure 3:
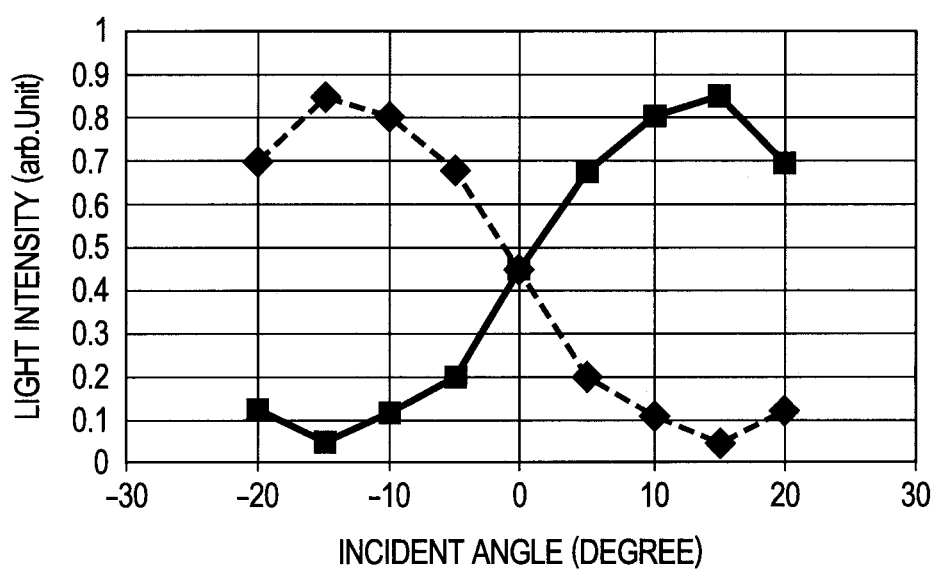
FIG. 3 is a graph illustrating dependence of detected light intensity on incident angle in the pixel according to the first embodiment.

FIG. 3 illustrates dependence on incident angle of light which propagates through the sub waveguide 104 or the sub waveguide 105 of the pixel 100 and exits to the photoelectric conversion unit side of the substrate 108.

The horizontal axis represents an incident angle of the incident light while the vertical axis represents light intensity. A solid line indicates the light intensity of light which exits from the sub waveguide 104 to the photoelectric conversion unit side while a broken line indicates the light intensity of light which exits from the sub waveguide 105 to the photoelectric conversion unit side.

It can be seen that, as illustrated in FIG. 3, light propagates through different sub waveguides depending on the incident angle and exits to the photoelectric conversion unit side in the substrate.

Next, a method of measuring the distance to a subject using the imaging device according to this embodiment is described with reference to FIGS. 4A and 4B.

Figure 4A:
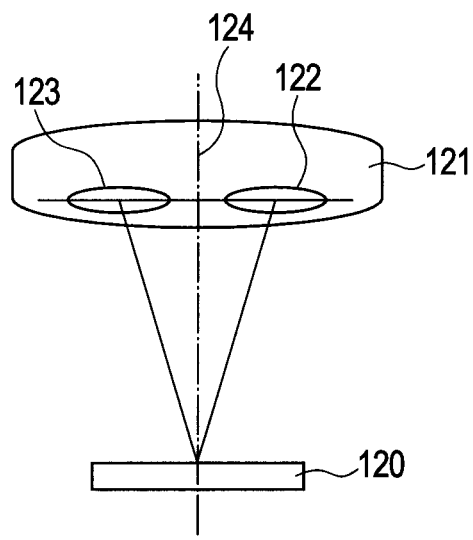
FIG. 4A is an explanatory view of a method of measuring the distance to a subject using the imaging device according to the first embodiment.
Figure 4B:
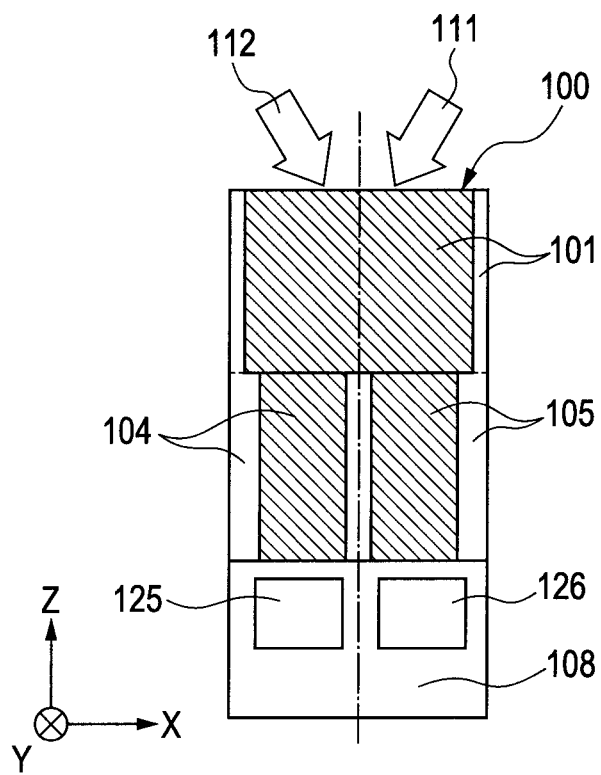
FIG. 4B is an explanatory view of the method of measuring the distance to the subject using the imaging device according to the first embodiment.

As illustrated in FIG. 4A, an image-forming lens 121 forms an image of an outside world onto a plane of an imaging device 120. The imaging device 120 includes multiple pixels 100, and as illustrated in FIG. 4B, includes in the substrate 108 a photoelectric conversion unit (first photoelectric conversion unit) 125 and a photoelectric conversion unit (second photoelectric conversion unit) 126.

The photoelectric conversion units 125 and 126 are disposed under the sub waveguides 104 and 105, respectively.

The distance between the image-forming lens 121 and the imaging device 120 is large for the size of the pixels. Therefore, light fluxes which pass through different regions on an exit pupil of the image-forming lens 121 are incident on the imaging device 120 as light fluxes at different incident angles.

In the photoelectric conversion unit 126 included in each of the pixels of the imaging device 120, a light flux which passes through a region 122 (first exit pupil region) which substantially corresponds to the first direction of the exit pupil of the image-forming lens 121 (exit pupil of an optical system which forms a subject image) is detected.

Similarly, in the photoelectric conversion unit 125, a light flux which passes through a region 123 (second exit pupil region) which substantially corresponds to the second direction of the exit pupil of the image-forming lens 121 is detected. Therefore, optical images which pass through different regions on the exit pupil of the image-forming lens 121 may be detected, and pixel signals from the multiple photoelectric conversion unit 126 and pixel signals from the multiple photoelectric conversion unit 125 are compared.

Thus, by a known method, a subject ranging signal may be created therefrom and may be output to detect the distance to the subject. Performing such a known method, it is available to use an arithmetic processing unit that performs a specific processing. Present invention includes the solid-state imaging device comprising the arithmetic processing unit.

Next, an example of a structure in which the width of the core member of the main waveguide becomes larger from the exit end surface 110 toward the incident end surface 109 is described with reference to FIG. 5.

In FIG. 5, the pixel 100 includes from a light incident side (+z side) a main waveguide 131 (a core member 132 and a clad member 133), the sub waveguides 104 and 105, and the substrate 108.

The sub waveguides 104 and 105 are disposed between the exit end surface 110 of the main waveguide 131 and the substrate 108. The core member 132 of the main waveguide 131 is formed so as to becomes larger (in a tapered shape) from the exit end surface 110 toward the incident end surface 109. Note that, the core member 132 is formed of a material having the refractive index which is higher than that of the clad member 133.

A light flux which has entered the pixel 100 from the outside propagates through the main waveguide 131 and the sub waveguides 104 and 105 to exit into the substrate 108.

If the photoelectric conversion unit is provided below the sub waveguide 104 or 105, exit light reaches the photoelectric conversion unit, is converted into electrons, and the electrons are output to the signal processing circuit (not shown).

By appropriately setting, in addition to the width and the height of the core member 132 of the main waveguide 131, the slant of the side wall of the tapered shape, the waveguide mode of the main waveguide 131 may be controlled in detail. Further, by coupling and propagating the waveguide mode of the main waveguide 131 and the waveguide modes of the sub waveguides 104 and 105, the properties of the incident angle of the pixel may be controlled in detail. For example, the incident angle at which the detected light is at the maximum and the way the detected light changes depending on the incident angle may be controlled in detail.

Further, if the core member 132 is in a tapered shape, a light flux which enters the whole surface of the pixel 100 may be introduced to the core members 106 of the sub waveguides 104 and 105, and light which exits to the substrate side may be increased.

With the tapered shape, a space in which wiring for extracting an electrical signal is provided and which is not illustrated in FIG. 5 may be secured. Further, the region in which light propagates is limited to a predetermined region in the pixel, and crosstalk which is caused by leakage of light to an adjacent pixel may be alleviated.

Figure 6:
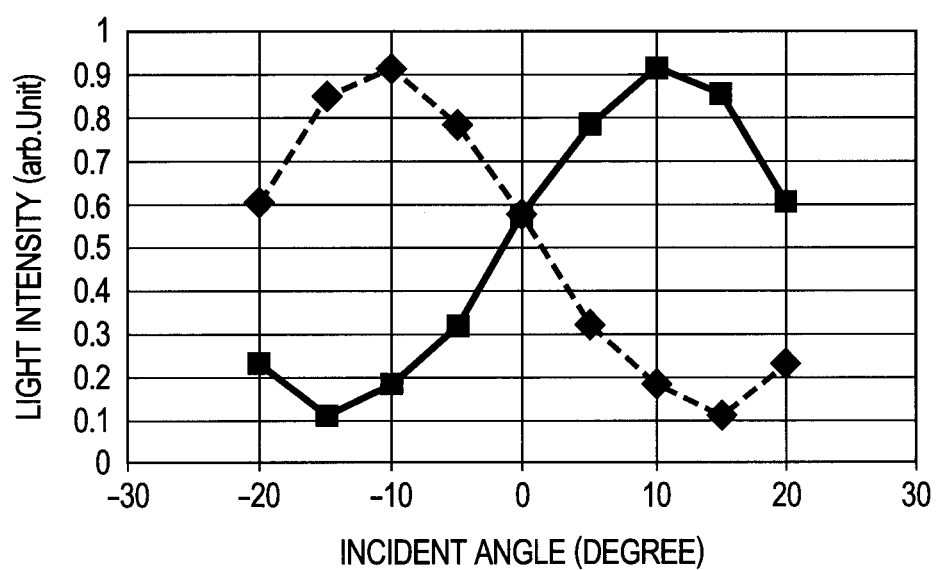
FIG. 6 is a graph illustrating dependence of detected light intensity on incident angle in the pixel according to the first embodiment.

FIG. 6 illustrates dependence on incident angle of light which propagates through the sub waveguide 104 or the sub waveguide 105 of the pixel 100 and exits to the substrate 108.

The horizontal axis denotes an incident angle of the incident light while the vertical axis denotes light intensity. A solid line indicates the light intensity of light which exits from the sub waveguide 104 while a broken line indicates the light intensity of light which exits from the sub waveguide 105.

It can be seen that, as illustrated in the figure, light propagates through different sub waveguides depending on the incident angle and exits into the substrate.

It is preferred that the slant of the side wall of the main waveguide 131 be gentle. Light which enters the main waveguide 131 is totally reflected by the side wall and propagates.

As the slant of the side wall becomes steeper, the angle at which the incident light enters the side wall becomes shallower, and light which is totally reflected is reduced.

By causing the slant of the side wall to be gentle, light which is totally reflected is increased, and light which propagates is increased.

Further, as light in the waveguide propagates, change in the width of the waveguide converts the waveguide mode. As the slant of the side wall becomes steeper, the waveguide mode is converted more abruptly, and a part of the light becomes more liable to be converted into reflected light or scattered light which are other than a waveguide mode.

By causing the slant of the side wall to be gentle, the ratio of light which is converted into light that is other than a waveguide mode is lowered, and light may be caused to propagate with efficiency.

The angle formed between the side wall of the main waveguide 131 and an optical axis (z axis) is desirably equal to or smaller than 45 degrees, and more desirably equal to or smaller than 35 degrees.

By causing the side wall of the main waveguide 131 to form such an angle, light may propagate with efficiency.

Note that, in the present invention, the shape of the core member of the main waveguide 131 is not limited to the tapered shape, and the side wall may be in a stepped shape.

For example, a structure may be employed in which two or a lot of waveguides with different core member widths are disposed one by one so that the widths of the core members become larger from the exit side toward the incident side.

Such a structure may be easily manufactured by manufacturing and stacking the waveguides one by one from the exit side, and the above-mentioned effects may be obtained.

For the purpose of causing light in the main waveguide 131 to propagate in different waveguide modes and introducing the light to the sub waveguides, a state in which multiple eigenmodes may exist at the exit end surface 110 of the main waveguide 131 is desired.

The number of the eigenmodes is determined by the width of the waveguide, the refractive index of the medium which forms the waveguide, and the wavelength of light which propagates. It is preferred that the width of the core member 132 at the exit end surface 110 be long.

It is desired that the width of the core member 132 at the exit end surface 110 be 1.5 times or more larger than the product obtained by multiplying the wavelength of light to be detected by the refractive index of the medium which forms the core member 132, and it is more desired that the width of the core member 132 at the exit end surface 110 be more than two times or more larger than the product.

This enables existence of multiple eigenmodes at the exit end surface 110 of the main waveguide 131 and the above-mentioned effects may be obtained.

It is desired that the sub waveguides 104 and 105 be multimode waveguides in which multiple eigenmodes exist with regard to incident light to be detected.

The electric field distribution in a waveguide mode is determined by the sum of the multiple eigenmodes. As the number of the eigenmode becomes larger, the waveguide mode which has more various electric field distributions may exist.

By causing the sub waveguides to be multimode waveguides, the sub waveguides may be more easily coupled to the waveguide mode of the main waveguide with efficiency.

Light which propagates from the main waveguide 101 to the sub waveguides 104 and 105 may be increased to increase the detected light intensity.

As the detected light intensity becomes higher, effects of noise caused in the photoelectric conversion unit, wiring, and the like on an image signal is alleviated to improve the quality of the signal.

It is desired that the sub waveguide 104 and the sub waveguide 105 be disposed with sufficient space therebetween.

The electric field distribution of the waveguide mode ranges to the core member and the clad member.

When the sub waveguide 104 and the sub waveguide 105 are brought closer to each other, due to the overlapping electric field distributions which range to the clad members thereof, respectively, the waveguide modes of the two waveguides are coupled to each other, and a part of light which propagates through one of the sub waveguides propagates to the other of the sub waveguides. The light becomes noise to deteriorate the precision of detecting an image signal.

Further, when a photoelectric conversion unit is provided under each of the sub waveguides, it is necessary to form the photoelectric conversion unit, wiring, and the like so as to be closer to each other depending on the distance between the sub waveguides, which makes the manufacture difficult. The distance between the sub waveguides is desirably equal to or larger than $1/20$, more desirably equal to or larger than $1/10$, and further desirably equal to or larger than $1/5$ of the wavelength of incident light to be detected.

This may alleviate propagation of light which propagates through one sub waveguide to the other sub waveguide.

Note that, in order to detect the distance with high precision irrespective of the distance to and the location of the subject, it is desired that the first exit pupil region 122 and the second exit pupil region 123 be set so as to be symmetrical with respect to a center 124 of the exit pupil.

The first direction and the second direction are defined with respect to a main light beam which passes through the center 124 of the exit pupil and enters the imaging device.

More specifically, when the main light beam enters the plane of the imaging device in an oblique direction, the first direction and the second direction are respectively defined so as to form an equal angle with the incident angle of the oblique main light beam in opposite directions. By changing the shape of the core member of the main waveguide, the spatial distribution of the waveguide mode depending on the incident angle of incident light may be changed.

By determining the locations at which the sub waveguides 104 and 105 are provided based on the spatial distribution of the waveguide mode, necessary dependence of detected light intensity on incident angle may be materialized.

When the position of the exit pupil of the image-forming lens is at a finite distance from the plane of the imaging device and the incident angle of the main light beam varies depending on the field of view, the shape of the core member in a pixel and the disposition of the sub waveguides 104 and 105 may be changed within the plane of the imaging device according to the amount of change in the incident angle.

Further, the disposition of the photoelectric conversion units may be changed according to the disposition of the sub waveguides 104 and 105.

The pixel 100 may be disposed in every pixel of the imaging device 120. This enables ranging in an arbitrary region or all the regions in the imaging device 120.

Further, light received by the photoelectric conversion units 125 and 126 included in each pixel 100 may be summed up (arithmetically processed) to be used as an image signal of a taken image. The pixel 100 may be prevented from becoming a defect pixel of the taken image and the quality of the taken image may be improved.

The sub waveguides and the photoelectric conversion units included in the pixel 100 are not limited to the disposition in this embodiment.

For example, the sub waveguides may be disposed in two rows and two columns (four in total). By disposing multiple such pixels, light which enter from a vertical direction and a horizontal direction may be separated. By providing the photoelectric conversion unit on the exit side of each sub waveguide, ranging of a subject having a pattern in the vertical direction and the horizontal direction may be carried out.

Alternatively, three or more sub waveguides may be disposed vertically or horizontally in the pixel 100. The exit pupil may be more finely divided, and, by disposing the photoelectric conversion unit on the exit side of each sub waveguide, ranging may be carried out with higher precision.

A color filter for limiting the wavelength band of light which enters the pixel 100 may be provided on the light incident side.

This may make smaller the effect of change in the waveguide mode due to the wavelength, and thus, the angle selectivity of the detected light intensity may be improved, and the precision of detecting the distance may be made higher.

The color filter is formed of a material which transmits light in a predetermined wavelength band and which absorbs, reflects, or scatters light in other wavelength bands, and, for example, an organic material or an inorganic material is used to form the color filter.

As described above, by providing the main waveguide and the multiple sub waveguides in the pixel and appropriately setting the shapes, the media, and the disposition of the respective waveguides, light according to the incident angle may be separated. By detecting the respective light beams, a solid-state imaging device which can carry out ranging with high precision may be materialized.

Figure 7A:
FIG. 7A is an explanatory view of a manufacturing process step of the solid-state imaging device including the pixel according to the first embodiment.
Figure 7B:
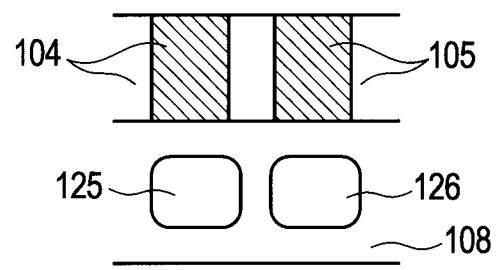
FIG. 7B is an explanatory view of a manufacturing process step of the solid-state imaging device including the pixel according to the first embodiment.
Figure 7C:
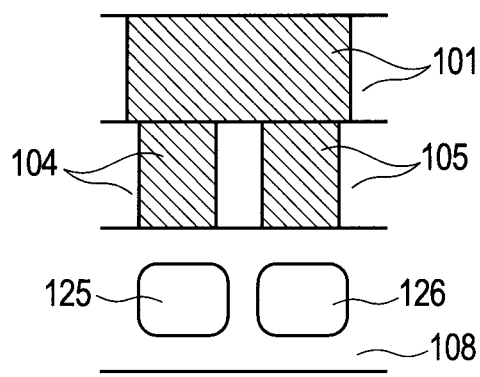
FIG. 7C is an explanatory view of a manufacturing process step of the solid-state imaging device including the pixel according to the first embodiment.

FIGS. 7A to 7C are used to describe manufacturing process steps of the solid-state imaging device including the pixel 100 according to this embodiment.

First, ions are implanted at a predetermined location of the substrate 108 formed of silicon to form the photoelectric conversion units 125 and 126. After wiring and the like (not shown) are formed, the substrate is made to be a thin film by CMP, etch back, or the like from a rear side (FIG. 7A).

Then, the sub waveguides 104 and 105 are formed by forming a SiN film, forming the core member 106 by photolithography, lift-off, and the like, and forming an SOG film and carrying out flattening by CMP, etch back, or the like to form the clad member 107 (FIG. 7B). Further, by forming the main waveguide 101, the pixel 100 may be manufactured (FIG. 7C).

A medium which forms the solid-state imaging device according to the present invention is not limited to this embodiment, and other media may be used.

Media which are different from each other may be used for the core members of the main waveguide and the sub waveguides, or for the clad members of the main waveguide and the sub waveguides.

Figure 8:
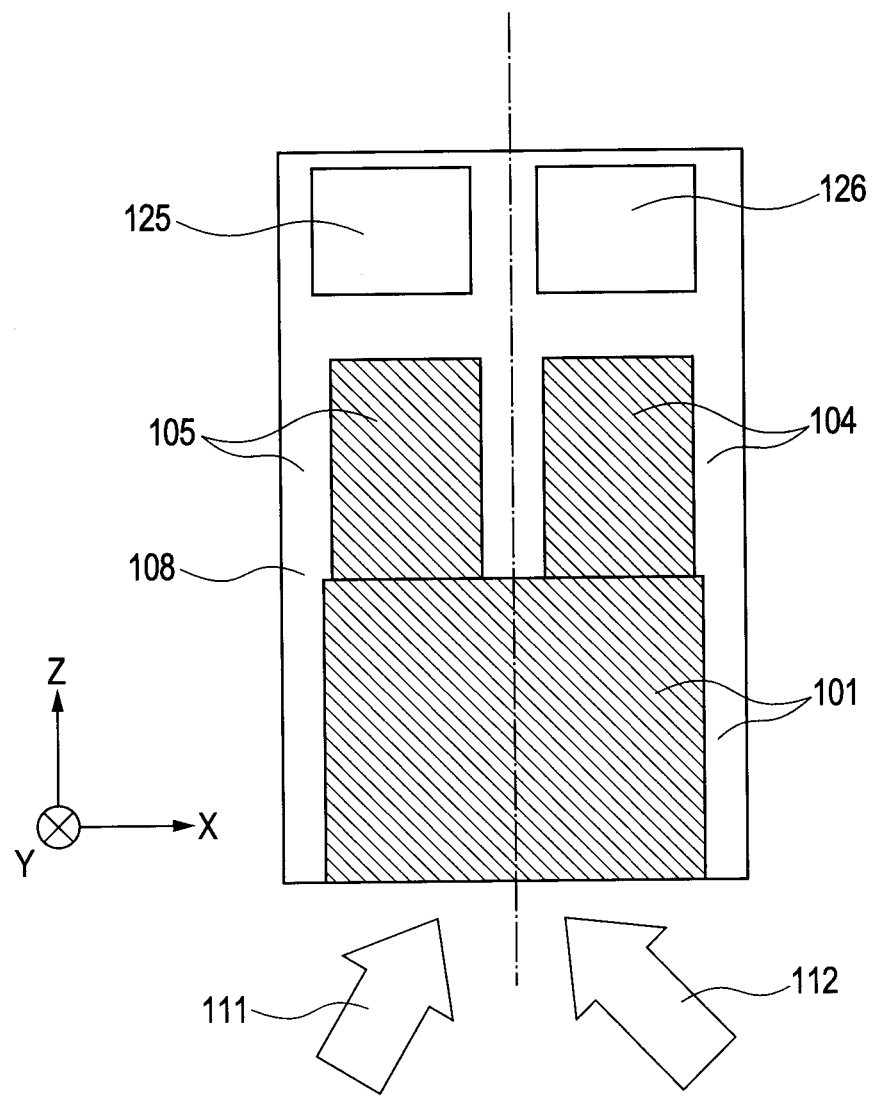
FIG. 8 is a schematic sectional view of a ranging pixel disposed in the solid-state imaging device according to the first embodiment.

According to the present invention, as illustrated in FIG. 8, the structure may be of a rear surface incident type in which the main waveguide 101 and the sub waveguides 104 and 105 are provided in the silicon substrate 108.

The photoelectric conversion units are disposed on a front side (+z side) of the sub waveguides 104 and 105 in the substrate.

With such a structure, light which enters from a rear side of the substrate (light which propagates in the +z direction) is detected. Wiring and the like may be disposed on a front side of the silicon substrate 108, and thus, hindrance to propagation of incident light by the wiring and the like may be avoided.

Further, spatial constraints due to the wiring and the like are alleviated, the shapes of the main waveguide and the sub waveguides may be more freely selected, and incident light may be introduced to the photoelectric conversion units with efficiency.

Second Embodiment

As a second embodiment, another exemplary structure of the solid-state imaging device according to the present invention is described with reference to FIGS. 9A and 9B.

Figure 9A:
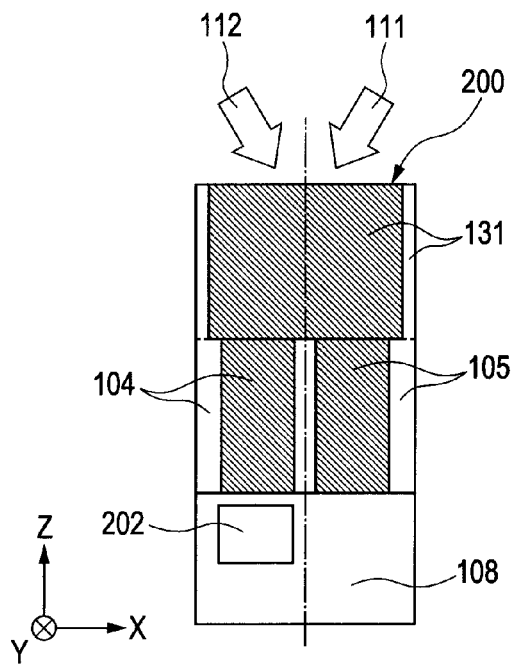
FIG. 9A is a schematic sectional view of a ranging pixel disposed in a part of a solid-state imaging device according to a second embodiment.
Figure 9B:
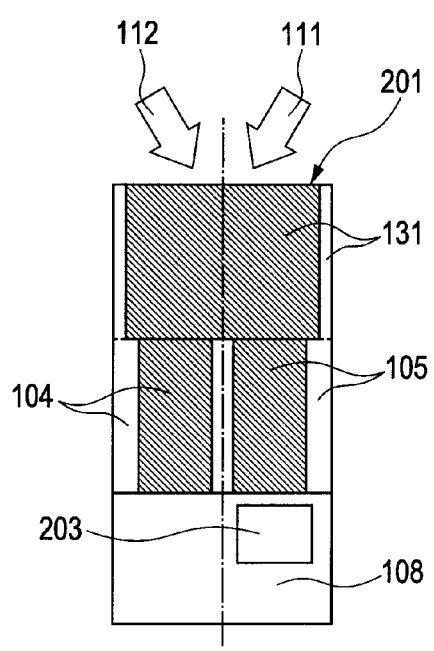
FIG. 9B is a schematic sectional view of a ranging pixel disposed in a part of the solid-state imaging device according to the second embodiment.

In FIGS. 9A and 9B, a ranging pixel 200, 201 is disposed in a part of the solid-state imaging device of this embodiment.

The pixel (first pixel) 200 and the pixel (second pixel) 201 each include from a light incident side (+z side) a main waveguide 131 (a core member 132 and a clad member 133), sub waveguides 104 and 105, and a substrate 108 having a photoelectric conversion unit 202 or 203.

The photoelectric conversion unit 202 or 203 is provided on the exit side of the sub waveguides 104 and 105, respectively.

The light flux 111 which has entered the pixel 200 illustrated in FIG. 9A in the first direction from the outside propagates, similarly to the case of the first embodiment, through the main waveguide 131 and the sub waveguide 104, and is introduced to the photoelectric conversion unit 202. On the other hand, the light flux 112 which has entered from the second direction propagates through the main waveguide 131 and the sub waveguide 105. Light that propagates through the sub waveguide 105 exits into the substrate 108, and is absorbed and damped.

This enables detection of the light flux 111 which enters from the first direction. Similarly, in the pixel 201 illustrated in FIG. 9B, the light flux 112 which enters from the second direction may be detected. By a signal of detection by the photoelectric conversion unit 202, 203 included in the respective pixels which are the multiple pixels 200 and 201 disposed, similarly to the case of the first embodiment, the distance to the subject may be detected with precision.

Further, signals of detection by the photoelectric conversion unit 202, 203 may be summed up to be used as an image signal in the pixels 200 and 201 of a taken image.

With such a structure, crosstalk which is caused by entering to the photoelectric conversion unit 203 of light which propagates through the sub waveguide 105 or by entering to the photoelectric conversion unit 202 of light which propagates through the sub waveguide 104 may be suppressed.

Further, it is not necessary to provide the photoelectric conversion units 202 and 203 close to each other, which eases the manufacture.

Figure 10A:
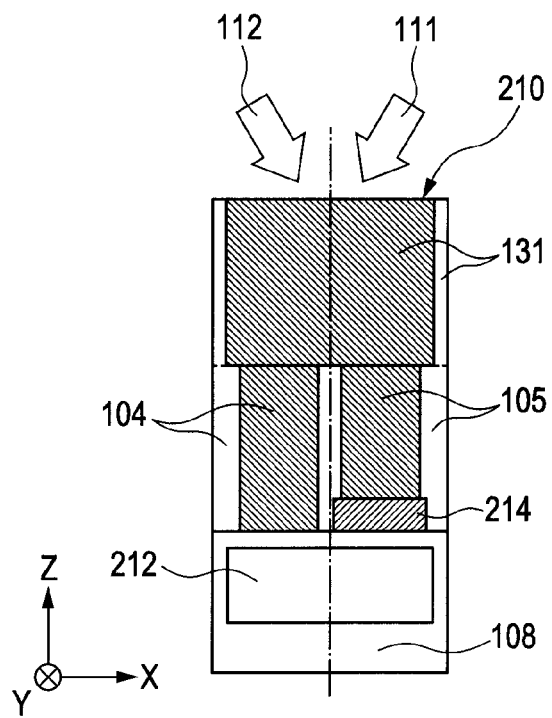
FIG. 10A is a schematic sectional view of a ranging pixel disposed in a part of the solid-state imaging device according to the second embodiment.
Figure 10B:
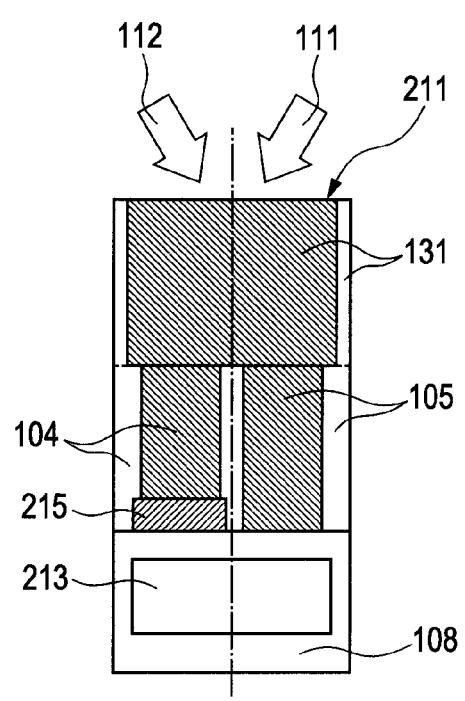
FIG. 10B is a schematic sectional view of a ranging pixel disposed in a part of the solid-state imaging device according to the second embodiment.

The pixels in the solid-state imaging device according to the present invention may also have structures illustrated in FIGS. 10A and 10B.

Pixels 210 and 211 each include the main waveguide 131, the sub waveguides 104 and 105, and the substrate 108 which has therein a photoelectric conversion unit 212 or 213. Light blocking member 214 or 215 is disposed in a part of the sub waveguide 104 or the sub waveguide 105.

The light flux 111 which has entered the pixel 210 illustrated in FIG. 10A in the first direction from the outside propagates, similarly to the case of the first embodiment, through the main waveguide 131 and the sub waveguide 104, and is introduced to the photoelectric conversion unit 212.

On the other hand, the light flux 112 which has entered from the second direction propagates through the main waveguide 131 and the sub waveguide 105.

Light which propagates through the sub waveguide 105 is blocked by the light blocking member 214, and thus, does not reach the photoelectric conversion unit 212.

This enables detection of the light flux 111 which enters from the first direction.

Similarly, in the pixel 211 illustrated in FIG. 10B, the light flux 112 which enters from the second direction may be detected.

By a signal of detection by the photoelectric conversion unit 212, 213 included in the respective pixels which are the multiple such pixels 210 and 211 disposed, similarly to the case of the first embodiment, the distance to the subject may be detected with precision.

Further, signals of detection by the photoelectric conversion unit 212, 213 may be summed up to be used as an image signal in the pixels 210 and 211 of a taken image.

Note that, the structures of the main waveguide 131 and the sub waveguides 104 and 105 are not limited to this embodiment, similarly to the case of the first embodiment, other structures may be adopted.

Further, according to the present invention, an imaging system including the solid-state imaging device described above and an optical system for forming a subject image for the solid-state imaging device may be formed.

In the imaging system, the light which enters from the above-mentioned first direction is adapted to pass through a first exit pupil region that is on a surface of the exit pupil of the optical system and to enter the main waveguide.

Further, the light which enters from the second direction is adapted to pass through a second exit pupil region that is on the surface of the exit pupil of the optical system and is different from the first exit pupil region and to enter the main waveguide.

Here, the above-mentioned first exit pupil region and the above-mentioned second exit pupil region may adopt a structure of being located so as to be symmetrical with each other with respect to a center of the exit pupil of the optical system.

REFERENCE SIGNS LIST

100: pixel for measuring distance
101: main waveguide

102: core member
103: clad member
104, 105: sub waveguide
106: core member
107: clad member
108: substrate
111, 112: light flux While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2011-007708, filed on Jan. 18, 2011, which is herein incorporated by reference as part of this application.

The invention claimed is:

1. A solid-state imaging device having multiple pixels, comprising:
   an optical waveguide; and
   first and second photoelectric conversion units, each adapted for converting light guided through the optical waveguide into an electrical signal,
   the optical waveguide including a main waveguide located on a light incident side, and first and second sub waveguides, each sub waveguide being connected to the main waveguide and located on the photoelectric conversion unit side, each of the main waveguide, the first sub waveguide and the second sub waveguide having a core member and a clad member, wherein
   the main waveguide guides light which enters from a first direction and light which enters from a second direction; and
   the first sub waveguide guides light which has entered from the first direction and has passed through the main waveguide to the first photoelectric conversion unit and the second sub waveguide guides light which has entered from the second direction and has passed through the main waveguide to the second photoelectric conversion unit.

2. The solid-state imaging device according to claim 1, wherein
   in the first sub waveguide, an intensity of light which enters from the first direction, introduced by the first sub waveguide, and exits is higher than an intensity of light which enters from the second direction, introduced by the first sub waveguide, and exits; and
   in the second sub waveguide, an intensity of light which enters from the second direction, introduced by the second sub waveguide, and exits is higher than an intensity of light which enters from the first direction, introduced by the second sub waveguide, and exits.

3. The solid-state imaging device according to claim 1, wherein the first sub waveguide and the second sub waveguide are disposed with space therebetween which is equal to or larger than 1/20 of a wavelength of incident light that is introduced to the first and second photoelectric conversion units and is detected.

4. The solid-state imaging device according to claim 1, wherein the first sub waveguide and the second sub waveguide are multimode waveguides relative to incident light to be detected.

5. The solid-state imaging device according to claim 1, wherein a width of an exit end in the main waveguide is 1.5 times or more larger than a wavelength of incident light which is introduced to the first and second photoelectric conversion units and is detected multiplied by a refractive index of a medium which forms the core member of the main waveguide.

6. The solid-state imaging device according to claim 1, wherein the core member of the main waveguide becomes larger in width from an exit side toward the light incident side.

7. The solid-state imaging device according to claim 1, wherein in each of the multiple pixels
   the first photoelectric conversion unit is provided on an exit side of the first sub waveguide; and
   the second photoelectric conversion unit is provided on an exit side of the second sub waveguide.

8. The solid-state imaging device according to claim 1, wherein
   the multiple pixels comprise a first pixel and a second pixel, each having the optical waveguide;
   the first photoelectric conversion unit is provided on the exit side of the first sub waveguide of the first pixel; and
   the second photoelectric conversion unit is provided on the exit side of the second sub waveguide of the second pixel.

9. The solid-state imaging device according to claim 8, wherein
   the first pixel comprises in a part of the second sub waveguide a light blocking member for blocking propagating light; and
   the second pixel comprises in a part of the first sub waveguide a light blocking member for blocking propagating light.

10. The solid-state imaging device according to claim 1, wherein an arithmetic processing unit outputs a ranging signal of a subject based on signals from the first photoelectric conversion unit and the second photoelectric conversion unit.

11. The solid-state imaging device according to claim 1, wherein signals from the first photoelectric conversion unit and the second photoelectric conversion unit included in the pixel are summed up to be used as an image signal in the pixel.

12. An imaging system, comprising:
   the solid-state imaging device according to claim 1; and
   an optical system for forming a subject image for the solid-state imaging device, wherein
   light which enters from the first direction passes through a first exit pupil region that is on a surface of an exit pupil of the optical system and enters the main waveguide; and
   light which enters from the second direction passes through a second exit pupil region that is on the surface of the exit pupil of the optical system and is different from the first exit pupil region and enters the main waveguide.

13. The imaging system according to claim 12, wherein the first exit pupil region and the second exit pupil region are located so as to be symmetrical with each other with respect to a center of the exit pupil of the optical system.

* * * * *